(12) United States Patent
Vining et al.

(10) Patent No.: US 10,879,893 B1
(45) Date of Patent: Dec. 29, 2020

(54) PASSIVE DETECTION OF DEVICE DECOUPLING

(71) Applicant: TEXAS INSTRUMENTS INCORPORATED, Dallas, TX (US)

(72) Inventors: Suzanne Mary Vining, Plano, TX (US); Win Naing Maung, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/779,055

(22) Filed: Jan. 31, 2020

Related U.S. Application Data

(60) Provisional application No. 62/883,671, filed on Aug. 7, 2019.

(51) Int. Cl.
*H03K 17/22* (2006.01)
*H03K 17/687* (2006.01)

(52) U.S. Cl.
CPC ......... *H03K 17/687* (2013.01); *H03K 17/223* (2013.01)

(58) Field of Classification Search
CPC combination set(s) only.
See application file for complete search history.

(56) References Cited

U.S. PATENT DOCUMENTS

| | | | |
|---|---|---|---|
| 7,400,866 B2 * | 7/2008 | Smentek | H03G 3/3084 455/115.1 |
| 7,450,907 B2 * | 11/2008 | Shurvinton | H03G 3/3047 370/328 |
| 8,554,961 B2 | 10/2013 | Yehuda | |
| 2017/0331270 A1 | 11/2017 | Mattos et al. | |

FOREIGN PATENT DOCUMENTS

| | | |
|---|---|---|
| CN | 106095715 | 11/2016 |
| WO | 2016168987 | 10/2016 |

OTHER PUBLICATIONS

International Search Report in corresponding PCT Application No. PCT/US2020/045097, dated Nov. 5, 2020 (2 pages).

* cited by examiner

*Primary Examiner* — An T Luu
(74) *Attorney, Agent, or Firm* — John R. Pessetto; Charles A. Brill; Frank D. Cimino

(57) ABSTRACT

Aspects of the present disclosure provide for a method. In at least some examples, the method includes controlling a switch to decouple a first node at which a pull-up signal is present from a second node. The method further includes measuring and storing a value of the pull-up signal as a reference value. The method further includes controlling the switch to couple the first node at which the pull-up signal is present to the second node. The method further includes determining whether a pull-down signal is present at the second node by comparing the reference value to a value of a signal present at the second node.

20 Claims, 2 Drawing Sheets

US 10,879,893 B1

PASSIVE DETECTION OF DEVICE DECOUPLING

CROSS-REFERENCE TO RELATED APPLICATIONS

The present application claims priority to U.S. Provisional Patent Application No. 62/883,671, which was filed Aug. 7, 2019, is titled "Passive Detection of Host Disconnect by USB 2.0 Device," and is hereby incorporated herein by reference in its entirety.

SUMMARY

At least some aspects of the present disclosure provide for a circuit. In some examples, the circuit includes a switch configured to couple between a first node and a second node. The circuit further includes an analog-to-digital converter (ADC) comprising an input terminal coupled to the second node and an output terminal. The circuit further includes a controller comprising a first input terminal coupled to the output terminal of the ADC, a second input terminal, and an output terminal. The circuit further includes a digital-to-analog converter (DAC) comprising an input terminal coupled to the output terminal of the controller and an output terminal. The circuit further includes a comparator comprising a first input terminal coupled to the second node, a second input terminal coupled to the output terminal of the DAC, and an output terminal coupled to the second input terminal of the controller.

Other aspects of the present disclosure provide for a system. In at least some examples, the system includes a first device and a peripheral device. The first device comprises a switch configured to couple between a first node and a second node. The first device further comprises an ADC comprising an input terminal coupled to the second node and configured to output a reference value in a digital format. The first device further comprises a DAC comprising an input terminal configured to receive the reference value in the digital format and an output terminal. The first device further comprises a comparator comprising a first input terminal coupled to the second node, a second input terminal coupled to the output terminal of the DAC, and an output terminal.

Other aspects of the present disclosure provide for a method. In at least some examples, the method includes controlling a switch to decouple a first node at which a pull-up signal is present from a second node. The method further includes measuring and storing a value of the pull-up signal as a reference value. The method further includes controlling the switch to couple the first node at which the pull-up signal is present to the second node. The method further includes determining whether a pull-down signal is present at the second node by comparing the reference value to a value of a signal present at the second node.

BRIEF DESCRIPTION OF THE DRAWINGS

For a detailed description of various examples, reference will now be made to the accompanying drawings in which.

DETAILED DESCRIPTION

Figure 1:
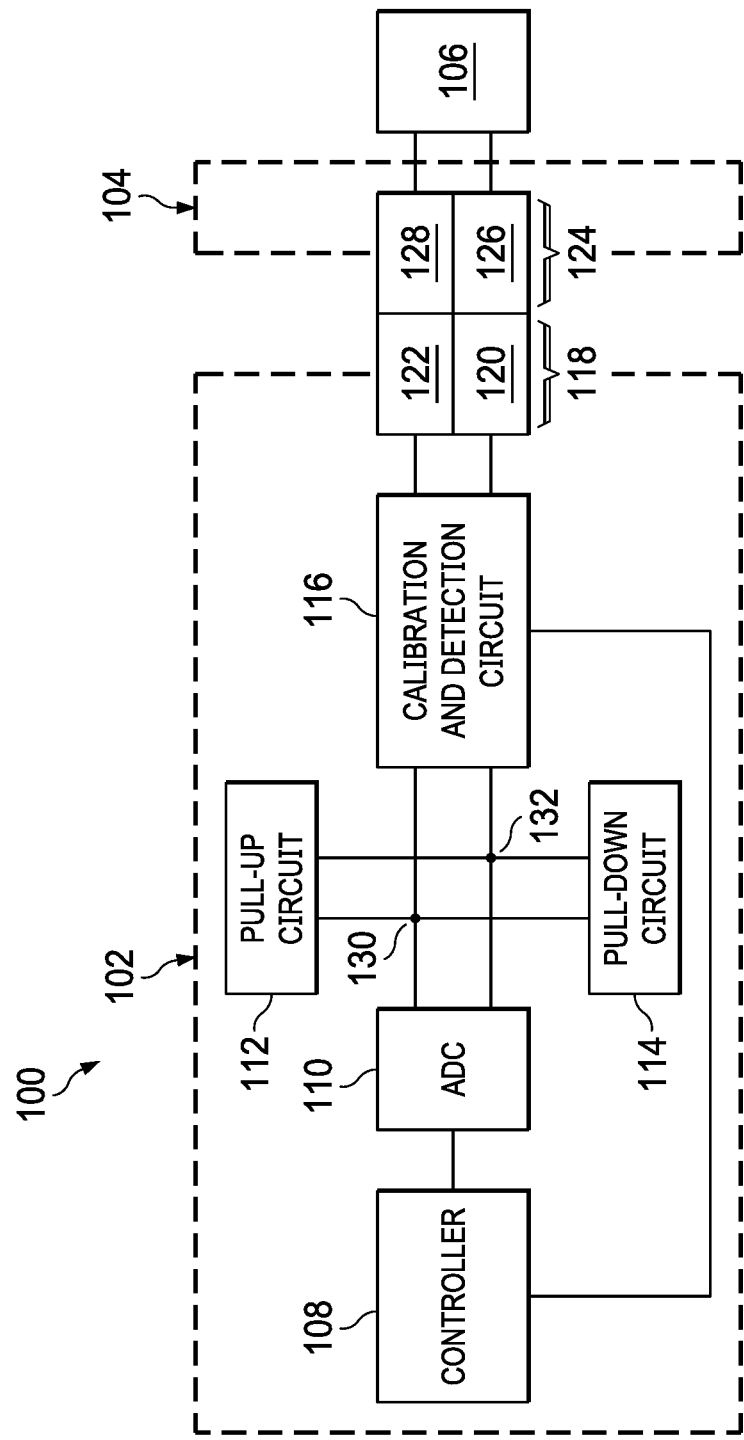
FIG. 1 shows a block diagram of an illustrative system in accordance with various examples.

In at least some implementations of communication interfaces between devices, it is advantageous to detect a de-coupling of the devices. For example, detecting the de-coupling of devices enables one or both of the devices to enter a low-power mode or make other modifications to operation that are desirable to at least some users in at least some circumstances or applications of the devices. In some implementations, a first device detects the de-coupling from a second device through an active detection process. For example, the first device couples to the second device via a pin and electrical conductor. The second device applies a pull-down signal to the electrical conductor to indicate that the second device is coupled to the electrical conductor.

In some examples, the first device determines that the second device is coupled to the electrical conductor through an active detection. For example, the first device applies a current to a pin of the first device that is coupled to the electrical conductor. When the pull-down signal applied by the second device is present, the first device detects a first voltage at the pin when the current is applied. In contrast, when the pull-down signal is not present, the first device detects a second voltage, having a value greater than that of the first voltage, at the pin.

While effective in at least some applications in determining presence, or lack thereof, of the second device coupled to the first device via the electrical conductor, in some examples, application of the current to the pin for the active detection process is undesirable. For example, in certain applications, the current applied for the active detection process interferes with normal and regular operation of the first device and/or the second device, inhibits proper performance and accurate measurement in certification testing, and/or imparts other potentially undesirable characteristics to operation. Accordingly, in at least some systems, a passive detection process for determining whether the second device has been decoupled from the first device is advantageous and/or desirable.

At least some aspects of the present disclosure provide for a determination of decoupling of devices in a system. In at least some examples, the devices are Universal Serial Bus (USB) devices, but in other examples, the devices communicate according to other communication protocols, the scope of which is not limited herein. The determination of decoupling is performed in a passive manner, or according to a passive detection process. As used herein, passive detection refers to detection of decoupling of devices without applying a current to a pin, through which coupling of the devices occurs, for the purpose of determining the presence, or lack thereof, of the coupling between the devices. For example, according to the passive detection process a first device configured to couple to a second device via a pin, without applying a current to the pin for the purpose of determining whether the second device is coupled to the pin, determines whether the second device is coupled to the pin. In at least some examples, the first device is a peripheral device and the second device is a host device.

The passive detection process, in at least some examples, is transparent to normal operation of both the first device and the second device. In this way, the passive detection process is capable of continuous, ongoing, and/or repeated performance without affecting normal operation of the first device and/or the second device. For example, in at least some implementations, the passive detection process does not affect a value of a signal at a pin of the first device that is configured to couple to the second device.

To perform the passive detection, in at least some examples, the first device measures and records a value of a pull-up signal at a time of startup of the first device as a reference value. When performing the measurement, in at least some examples, the first device decouples, via a switch, a node at which the pull-up signal is present (e.g., such as a terminal of a pull-up resistor) from the pin at which the first device is configured to couple to the second device. The reference value, in some examples, represents a value of the pull-up signal applied by the first device as would be approximately present at the pin in the absence of the switch and further in the absence of a pull-down signal applied by the second device. In various other examples, the reference value is generated according to any suitable means, architecture, or process, the scope of which is not limited herein.

In at least some examples, the reference value is stored by a processing unit of the first device. The processing unit is, in some examples, a controller or digital core of the first device. In at least some examples, the controller is a USB controller and the reference value is stored in a digital format in a register, cache, or other storage that is rewritable. After performing the measurement and storing the value, in at least some examples, the first device recouples the node at which the pull-up signal is present to the pin at which the first device is configured to couple to the second device. Further, after storing the reference value, in at least some examples, the controller outputs the reference value in the digital format and the first device converts the reference value to an analog format. The first device subsequently compares the reference value to a signal present at the pin, for example, via a comparator having a predetermined offset value. When the reference value minus the voltage present at the pin is greater than the offset value, the first device determines that the second device is coupled to the first device via the pin and is applying a pull-down signal to the pin. When the reference value minus the voltage present at the pin is greater than the offset value, the comparator outputs an asserted signal (in at least some examples, a logic-level high signal). Similarly, when the reference value minus the voltage present at the pin is less than the offset value, the first device determines that the second device has been decoupled from the first device. When the reference value minus the voltage present at the pin is less than the offset value, the comparator outputs a de-asserted signal (in at least some examples, a logic-level low signal).

Turning now to FIG. 1, a block diagram of an illustrative system 100 is shown. In at least some examples, the system 100 is representative of at least a portion of a communication system. For example, the system 100 is representative of at least some implementations of a USB communication system. In one example, the system 100 includes a device 102, a conductor 104, and a device 106. The device 102, in at least one example, is configured to communicate with the device 106 via the conductor 104. Accordingly, in at least one example, the device 106 is a host device, such as a USB host device. In some implementations, the device 102 includes a controller 108, an analog-to-digital converter (ADC) 110, a pull-up circuit 112, and a calibration and detection circuit 116. In at least some examples, in which the device 102 is also capable of operating as a host device, the device 102 further includes a pull-down circuit 114.

The controller 108, in at least one example, is a microcontroller having processing capabilities. In other examples, the controller 108 is processor, a micro-processor, a field-programmable gate array (FPGA), a component suitable for, or capable of, implementing a state machine, or any other suitable component or device having processing capabilities including those of receiving one or more inputs and generating one or more outputs based on rules, analysis, or other processing applied to at least some of the inputs. For example, when the controller 108 is a microcontroller, at least a portion of the controller 108 is implemented as particular programming within the controller 108 to perform at least some of the operations disclosed herein. For example, the controller 108 executes or implements software or other code for detecting decoupling of the device 106 from the device 102.

In at least some examples, the device 102 further includes a receptacle 118. The receptacle 118 includes one or more terminals through which the device 102 is configured to couple to the conductor 104 and, in some circumstances, the device 106. For example, in at least some implementations, the receptacle 118 includes a data terminal 120 (e.g., one of a positive polarity data terminal or a negative polarity data terminal) and a data terminal 122 (e.g., the other of the positive polarity data terminal or the negative polarity data terminal). In some examples, the controller 108 is configured to control the pull-up circuit 112 or the pull-down circuit 114 to apply a signal to the data terminal 120 and/or the data terminal 122. In at least one implementation, the controller 108 applies a pull-up signal to the data terminal 120 or the data terminal 122 to indicate a capability of the device 102. For example, when the device 102 is a USB device capable of full-speed or high-speed communication, the controller 108 controls the pull-up circuit 112 to pull up the data terminal 120. When the device 102 is a USB device capable of low-speed communication, the controller 108 controls the pull-up circuit 112 to pull up the data terminal 122. In at least some other examples, such as when the device operates as a host, high-speed, full-speed and low-speed operations capabilities of the data terminal 120 and the data terminal 122 are determined based on the signals applied to them rather than being predefined. For example, when the device 102 is also capable of operating as a host device, such as when one or more terminals (illustrated or un-illustrated) of the receptacle 118 are dual-role, the controller 108 controls the pull-down circuit 114 to pull down the data terminal 120 or the data terminal 122.

In at least one example, the conductor 104 includes a plug 124 configured to interact with the receptacle 118 to communicatively couple the conductor 104 to the device 102. The plug 124 houses, includes, or otherwise interacts with a first data terminal 126 and a second data terminal 128, each configured to communicatively couple the conductor 104 to the device 102.

The device 106 is any device suitable for communicating with the device 102 and the scope of the device 106, its hardware architecture, or its method of operation are not limited herein. In at least some examples, the device 106 also implements a controller substantially similar to the controller 108 and/or includes functionality substantially similar to the controller 108. Further, in at least one implementation, the device 106 is a USB host.

In an example of operation of the system 100, at startup of the device 102, the controller 108 controls the pull-up circuit 112 to pull up a node 130. The controller 108 further controls the calibration and detection circuit 116 to decouple the node 130 from the data terminal 120. After decoupling the node 130 from the data terminal 120, the controller 108 stores a value of a signal present at the node 130 as a reference value. In some examples, the controller 108 subsequently controls the pull-up circuit 112 to continue pulling-up the node 130 based on capabilities and/or a mode of operation of the device 102, as discussed above. In other examples, the controller 108 controls the pull-up circuit 112 to stop pulling-up the node 130 based on capabilities and/or a mode of operation of the device 102, again as discussed above. The controller 108 further controls the calibration and detection circuit 116 to couple the node 130 to the data terminal 120.

While one architecture and process for generating the reference voltage are described above and illustrated in FIG. 1, it should be understood that the present disclosure does not foreclose the suitability of other forms of reference value generation. For example, in one alternative implementation, the device 102 includes multiple instances of the pull-up circuit 112, where one instance is coupled to the data terminal 120 and/or the data terminal 122 and another instance is coupled to the calibration and detection circuit 116 and provides the reference value. In such an example, the reference value is not converted to a digital value, stored, retrieved, and converted back to an analog value. Instead, the reference value would be directly generated and provided to the calibration and detection circuit 116. In such an implementation, at least some components of the device 102 become optional and are eligible for omission to save space and/or cost if no other uses exist for the components in the device 102.

During normal operation of the device 102 and the device 106 in which the device 102 and the device 106 are coupled via the conductor 104, the device 106 pulls down the data terminal 120 and the data terminal 122. This pull-down applied by the device 106 alters (e.g., reduces) a value present at the data terminal 120 or the data terminal 122 from a value present at the data terminal 120 or the data terminal 122 when the pull-down is not present. Accordingly, by comparing a value present at the data terminal 120, as reflected at the node 130, to the stored reference value, the device 102 is capable of determining whether the device 106 is still coupled to the device 102.

For example, the controller 108 outputs the stored reference value to the calibration and detection circuit 116. In some examples, the calibration and detection circuit 116 converts the reference value to an analog format. In other examples, the controller 108 outputs the stored reference value in an analog format. The calibration and detection circuit 116 subsequently compares the reference value in the analog format to a value of a signal present at the node 130. When the value of the signal present at the node 130 is less than the stored reference value by an amount greater than or equal to a predetermined offset value, the device 102 determines that the device 106 is coupled to the device 102 via the conductor 104. Conversely, when the value of the signal present at the node 130 is less than the stored reference value minus the predetermined offset value, the device 102 determines that the device 106 is decoupled from the device 102 via the conductor 104.

While discussed herein with respect to the node 130, in at least some examples, the teachings of the present disclosure are equally applicable to the node 132. For example, the controller 108 controls the pull-up circuit 112 and the calibration and detection circuit 116 to measure and store reference values associated with the node 130 and the node 132 and to monitor the node 130 and the node 132 for an indication of decoupling of the device 106 from the device 102. However, for the sake of clarity of description, the above detection process is discussed herein only with respect to the node 130.

Figure 2:
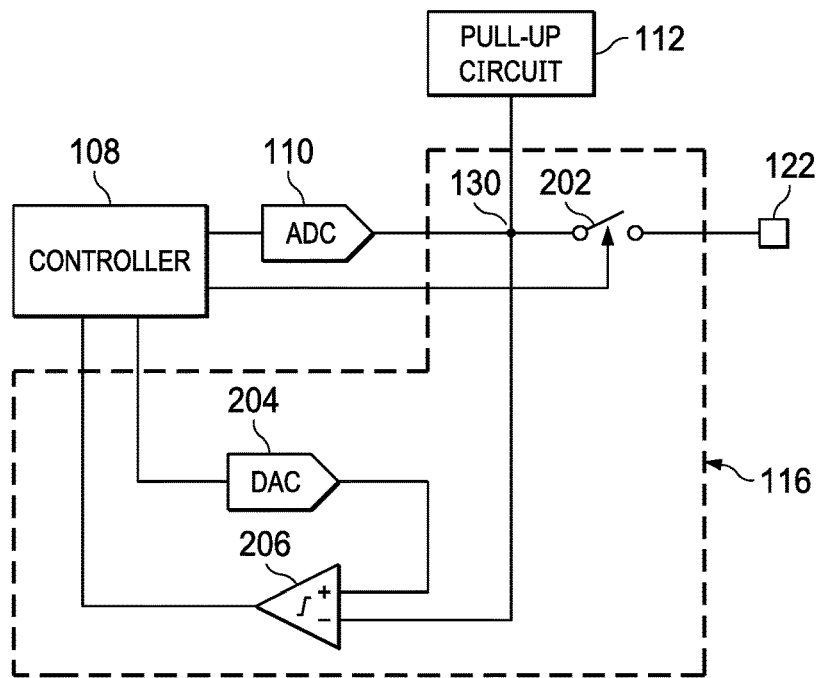
FIG. 2 shows a schematic diagram of an illustrative implementation of a calibration and detection circuit in accordance with various examples.

Turning now to FIG. 2, a schematic diagram of an illustrative implementation of the calibration and detection circuit 116 is shown. In at least one implementation, the calibration and detection circuit 116 includes a switch 202, a digital-to-analog converter (DAC) 204, and a comparator 206. Additionally, in at least one example, the ADC 100 has an input terminal coupled to a node 130 and an output terminal coupled to an input terminal of the controller 108. The switch 202 includes a first terminal coupled to the first data terminal 122 and a second terminal coupled to the node 130 and is configured to receive a control signal, such as from the controller 108. In at least one example, the switch 202 is implemented as a solid-state switching device, such as a transistor of any suitable process technology. The DAC 204 has an input terminal coupled to the controller 108 and an output terminal. The comparator 206 has a first input terminal (e.g., a positive or non-inverting input terminal) coupled to the output terminal of the DAC 204 and a second input terminal (e.g., a negative or inverting input terminal) coupled to the node 130. An output terminal of the comparator 206 is coupled to an input terminal of the controller 108. In at least some examples, the comparator 206 has a predetermined offset value. In at least some implementations, this predetermined offset value is about 100 millivolts such that the comparator 206 outputs an asserted signal when a value of a signal received at the first input terminal exceeds a value of a signal received at the second input terminal plus the predetermined offset value of about 100 millivolts.

In an example of operation of the calibration and detection circuit 116, the switch 202 receives a control signal from the controller 108. The control signal, in some examples, causes the switch 202 to open, decoupling the node 130 from the data terminal 120, or close, coupling the node 130 to the data terminal 120. For example, when the device 102 starts up (e.g., is powered-up), is initialized, or otherwise begins operating, the controller controls the switch 202 to open, decoupling the node 130 from the data terminal 120. After the node 130 is decoupled from the data terminal 120, the ADC 110 measures a value of the signal (e.g., a pull-up signal provided by the pull-up circuit 112) present at the node 130 and outputs that measurement as a reference value in a digital format. The controller 108 receives the reference value and stores the reference value. Subsequently, the controller 108 modifies a value of the control signal such that the control signal causes the switch 202 to close, coupling the node 130 to the data terminal 120.

After the switch 202 couples the node 130 to the data terminal 120, the controller 108 outputs the reference value to the DAC 204. The DAC 204 receives the reference value in the digital format, converts the reference value to an analog format, and outputs the reference value in the analog format. The comparator 206 receives the reference value in the analog format and compares the reference value to a signal present at the node 130. When the reference value is greater in value than the signal present at the node 130 plus the offset value of the comparator 206, the comparator 206 outputs an asserted signal indicating coupling with an external pulldown at the data terminal 120. When the reference value is lesser in value than the signal present at the node 130 plus the offset value of the comparator 206, the comparator 206 outputs a de-asserted signal indicating no coupling with an external pulldown at the data terminal 120.

As discussed above with respect to FIG. 1, while one architecture and process for generating the reference voltage are described above and illustrated in FIG. 2, it should be understood that the present disclosure does not foreclose the suitability of other forms of reference value generation. For example, in one alternative implementation, the calibration and detection circuit 116 is configured to couple to multiple instances of the pull-up circuit 112, where one instance is coupled to the data terminal 120 and/or the data terminal 122 and another instance is coupled to the second input terminal of the comparator 206 and provides the reference value. In such an example, the reference value is not converted to a digital value by the ADC 110, stored and retrieved by the controller 108, and converted back to an analog value by the DAC 204. Instead, the reference value would be directly generated and provided to the comparator 206. In such an implementation, at least some components of the device 102 and/or the calibration and detection circuit 116 become optional and are eligible for omission to save space and/or cost if no other uses exist for the components in the calibration and detection circuit 116. In at least one example, these components include the ADC 110, switch 202, and/or DAC 204.

In at least some examples, the calibration and detection circuit 116 provides an output of the comparator 206 to the controller 108. Based on the output of the comparator 206, in at least some examples, the controller 108 performs one or more actions. For example, when the output of the comparator 206 is asserted, the controller 108 determines that a pull-down signal is applied to the data terminal 120 (e.g., such that the controller 108 determines that the device 106 is coupled to the device 102 via the data terminal 120). Conversely, when the output of the comparator 206 is de-asserted, the controller 108 determines that a pull-down signal is not applied to the data terminal 120 (e.g., such that the controller 108 determines that the device 106 is decoupled from the device 102 via the data terminal 120).

The detection of presence or absence of the pull-down signal at the data terminal 120, in some examples, is performed passively. For example, the detection is performed without applying a current to the data terminal 120 for the purpose of detecting presence or absence of the pull-down signal at the data terminal 120. In this way, the detection is performed in a manner that does not affect normal operation of the device 102, impact communication between the device 102 and the device 106, or alter a value of the signal present at the data terminal 120 during normal operation of the device 102. As discussed above, in at least some examples, the components of the calibration and detection circuit 116 discussed with respect to the node 130 and the data terminal 120 are duplicated in both hardware and software functionality with respect to the node 132 and the data terminal 122.

Figure 3:
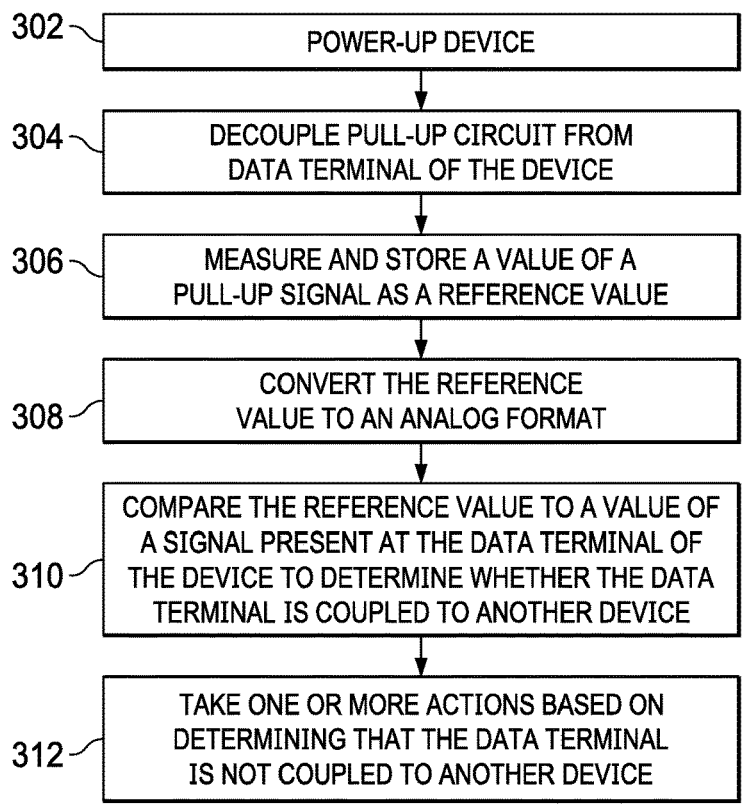
FIG. 3 shows a flowchart of an illustrative method in accordance with various examples.

Turning now to FIG. 3, a flowchart of an illustrative method 300 is shown. In at least some examples, the method 300 is a method for passive detection of decoupling of devices. For example, the method 300 is implemented in a communication device to passively determine whether a pull-down signal is present or absent from a terminal of the communication device. In at least one example, the method 300 is implemented in the device 102 of the system 100 of FIG. 1.

At operation 302, a device is powered-up. In various examples, the powering-up is at a time that the device is turned-on. In other examples, the powering-up is in response to resetting of the device. At operation 304, a pull-up circuit is decoupled from a data terminal of the device. The pull-up circuit is decoupled, in some examples, by controlling a switch to electrically decouple the data terminal from a node at which a pull-up signal generated by the pull-up circuit is present.

At operation 306, a value of the pull-up signal is measured and stored as a reference value. The value is measured, in some examples, by an ADC that generates a digital format representation of the value of the pull-up signal. The digital format representation of the value is stored, in some examples, as a reference value. After storing the value of the pull-up signal as the reference value, in some examples, the switch controlled to electrically decouple the data terminal from the node at which a pull-up signal generated by the pull-up circuit is present at operation 304 is controlled to electrically couple the data terminal from the node at which a pull-up signal generated by the pull-up circuit is present.

At operation 308, the reference value is converted to an analog format. For example, the reference value is converted to the analog format by a DAC. In some examples, the DAC is a standalone component. In other examples, the DAC is a component of a controller that received and stored the reference value in the digital format.

At operation 310, the reference value is compared to a value of a signal present at the data terminal of the device to determine whether the data terminal is coupled to another device. The comparison is performed, in some examples, by a comparator that receives the reference value and the signal present at the data terminal of the device. In at least some examples, when the reference value is greater in value than the signal present at the data terminal of the device plus a predetermined offset value, the device is coupled to another device that is loading or otherwise applying a pull-down signal to the data terminal of the device. Conversely, when the reference value is lesser in value than the signal present at the data terminal of the device plus the predetermined offset value, a pull-down signal is not being applied to the data terminal of the device. When the pull-down signal is not being applied to the data terminal of the device, in at least some examples the device determines that the data terminal is not coupled to another device. For example, the device determines that another device previously coupled to the data terminal of the device has been decoupled.

At operation 312, in at least some examples, the device takes one or more actions based on determining that the data terminal is not coupled to another device. Various examples of such actions include beginning a method or process of monitoring for a new coupling, entering a low-power mode of operation, triggering one or more operation or sub-routines in the device, or any other suitable actions.

While the operations of the method 300 have been discussed and labeled with numerical reference, in various examples the method 300 includes additional operations that are not recited herein. In some examples, any one or more of the operations recited herein include one or more sub-operations. In some examples, any one or more of the operations recited herein is omitted. In some examples, any one or more of the operations recited herein is performed in an order other than that presented herein (e.g., in a reverse order, substantially simultaneously, overlapping, etc.). Each of these alternatives is intended to fall within the scope of the present disclosure.

Further, in at least some examples the method 300 is separable into two separate sequences of operations. For example, in one implementation the operation 302, operation 304, and operation 306 are performed without performing the operation 308, operation 310, or operation 312. Such an implementation occurs, in some examples, for or when setting, generating, or otherwise determining the reference value. In another implementation, the operation 308, operation 310, and operation 312 are performed without performing the operation 302, operation 304, or operation 306. Such an implementation occurs, in some examples, for or when detecting that another device previously coupled to the data terminal of the device has been decoupled. Further, in at least some examples the operation 312 is omitted from a sequence of operations including the operation 308 and operation 310. This, in some examples, occurs when a determination is made that another device previously coupled to the data terminal of the device has been decoupled but no action is taken responsive to that determination.

In the foregoing discussion, the terms "including" and "comprising" are used in an open-ended fashion, and thus should be interpreted to mean "including, but not limited to. . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., field effect transistor (FET), metal oxide semiconductor FET (MOSFET), n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
   a switch having a first terminal and a second terminal;
   an analog-to-digital converter (ADC) comprising an input terminal coupled to the second terminal of the switch and an output terminal;
   a controller comprising a first input terminal coupled to the output terminal of the ADC, a second input terminal, and an output terminal;
   a digital-to-analog converter (DAC) comprising an input terminal coupled to the output terminal of the controller and an output terminal; and
   a comparator comprising a first input terminal coupled to the second terminal of the switch, a second input terminal coupled to the output terminal of the DAC, and an output terminal coupled to the second input terminal of the controller.

2. The circuit of claim 1, further comprising a pull-up circuit coupled to the second terminal of the switch.

3. The circuit of claim 1, wherein the first terminal of the switch is an output terminal of the circuit.

4. The circuit of claim 1, wherein the controller further comprises a second output terminal coupled to a control input of the switch.

5. The circuit of claim 1, wherein the controller is configured to control the switch to decouple the second terminal of the switch from the first terminal of the switch when the circuit powers up.

6. The circuit of claim 5, wherein the ADC is configured to generate a reference value based on a signal present at the second terminal of the switch when the second terminal of the switch is decoupled from the first node.

7. The circuit of claim 6, wherein the controller is configured to control the switch to couple the second terminal of the switch to the first terminal of the switch after the ADC generates the reference value.

8. The circuit of claim 7, wherein the comparator is configured to compare the reference value to a signal present at the first terminal of the switch to determine whether a pull-down signal is applied to the first node.

9. A system, comprising:
   a first device, comprising:
   a switch having a first terminal and a second terminal;
   an analog-to-digital converter (ADC) comprising an input terminal coupled to the second terminal of the switch and configured to output a reference value in a digital format;
   a digital-to-analog converter (DAC) comprising an input terminal configured to receive the reference value in the digital format and an output terminal; and
   a comparator comprising a first input terminal coupled to the second terminal of the switch, a second input terminal coupled to the output terminal of the DAC, and an output terminal.

10. The system of claim 9, comprising a second device coupled to the first terminal of the switch via a conductor, wherein the second device is configured to apply a pull-down signal to the first node via the conductor.

11. The system of claim 9, wherein the ADC comprises an output terminal at which the output reference value in the digital format is present, and wherein the first device further comprises a controller comprising a first input terminal coupled to the output terminal of the ADC, a second input terminal coupled to the output terminal of the comparator, a first output terminal coupled to the switch, and a second output terminal coupled to the input terminal of the DAC.

12. The system of claim 11, further comprising a pull-up circuit coupled to the second terminal of the switch.

13. The system of claim 12, wherein the controller is configured to control the switch to decouple the second terminal of the switch from the first terminal of the switch when the circuit powers up, wherein the ADC is configured to generate a reference value based on a signal present at the second terminal of the switch when the second node is decoupled from the first terminal of the switch, wherein the controller is configured to control the switch to couple the second terminal of the switch to the first terminal of the switch after the ADC generates the reference value, and wherein the comparator is configured to compare the reference value to a signal present at the first node to determine whether a pull-down signal is applied to the first terminal of the switch.

14. The system of claim 9, wherein the comparator is configured to compare the reference value to a signal present at the first terminal of the switch to determine whether a pull-down signal is applied to the first terminal of the switch.

15. The system of claim 14, wherein an output signal of the comparator is de-asserted when the pull-down signal is applied to the first terminal of the switch, and wherein the output signal of the comparator is asserted when the pull-down signal is not applied to the first terminal of the switch.

16. The system of claim 15, wherein the comparator determines whether the pull-down signal is applied to the first terminal of the switch passively without applying a current to the first terminal of the switch for a purpose of determining whether the pull-down signal is applied to the first terminal of the switch.

17. A method, comprising:
controlling a switch to decouple a first terminal at which a pull-up signal is present from a second terminal;
measuring and storing a value of the pull-up signal as a reference value;
controlling the switch to couple the first terminal at which the pull-up signal is present to the second terminal; and
determining whether a pull-down signal is present at the second terminal by comparing the reference value to a value of a signal present at the second terminal.

18. The method of claim 17, wherein the measuring is performed by an analog-to-digital converter (ADC) that generates the reference value in a digital format, and wherein prior to comparing the reference value to the value to the signal present at the second terminal the reference value is converted to an analog format by a digital-to-analog converter (DAC).

19. The method of claim 17, wherein the pull-down signal is present at the second terminal when the signal present at the second terminal is lesser in value than the reference value plus a predetermined offset value, and wherein the pull-down signal is not present at the second terminal when the signal present at the second terminal is not lesser in value than the reference value plus the predetermined offset value.

20. The method of claim 17, wherein the determination of whether the pull-down signal is present at the second terminal is made without applying a current to the second terminal for a purpose of determining whether the pull-down signal is present at the second terminal.

* * * * *